United States Patent [19]

Straate et al.

[11] Patent Number: 5,130,893

[45] Date of Patent: Jul. 14, 1992

[54] SIGNAL DISTRIBUTION SYSTEM

[75] Inventors: Russell A. Straate; Walter H. Strader; James Dickens, all of Lexington, Ky.

[73] Assignee: Square D Company, Palatine, Ill.

[21] Appl. No.: 630,647

[22] Filed: Dec. 20, 1990

Related U.S. Application Data

[63] Continuation of Ser. No. 466,541, Jan. 17, 1990.

[51] Int. Cl.$^5$ ............................................. H05K 7/00
[52] U.S. Cl. .................................. 361/392; 361/399; 361/410; 361/416
[58] Field of Search ............. 361/334, 380, 392, 394, 361/395, 399, 410, 413, 416

[56] References Cited

U.S. PATENT DOCUMENTS

| | | | |
|---|---|---|---|
| 4,679,728 | 6/1987 | Gregory | 361/395 |
| 4,901,205 | 2/1990 | Landis et al. | 361/399 |
| 4,920,453 | 4/1990 | Onose et al. | 361/392 |
| 4,926,291 | 5/1990 | Sarraf | 361/392 |
| 4,998,183 | 3/1991 | Chiang | 361/395 |
| 5,014,002 | 5/1991 | Wiscombe et al. | 324/158 |

*Primary Examiner*—Gregory D. Thompson
*Attorney, Agent, or Firm*—Jose W. Jimenez; Wayne Stoppelmoor; Larry I. Golden

[57] ABSTRACT

There is provided a distribution system and a wiring format which will not only provide for a common enclosure, which will help to centralize the entrance of services to a facility, but will also organize the services throughout the facility. In particular, the invention includes a signal distribution module that directs input signals to appropriate output signals throughout the facility. The signal distribution module will provide for easy installation and reconfiguration of the signal distribution system.

9 Claims, 9 Drawing Sheets

1

SIGNAL DISTRIBUTION SYSTEM

CROSS REFERENCE TO RELATED APPLICATION

This application is a continuation in part of application Ser. No. 07/466,541, filed Jan. 17, 1990.

FIELD OF THE INVENTION

The present invention generally relates to a signal distribution system for distributing input signals to proper output signals and, more particularly, to a signal distribution system for distributing input telephone and cable TV signals to appropriate locations in a facility.

BACKGROUND OF THE INVENTION

The present invention generally relates to communication and energy management systems and in particular to service entrance devices and wiring system for a particular facility.

The electrical contractor is installing the majority of telephone and video wiring in the home today. With the exception of the electrical system, the remainder of the residential wiring is unorganized. This creates problems in installing, adding and changing products that utilize and enhance the electrical, telephone and video services in the home or workplace. Telephone wire is installed in multi-drop configurations in the home today which limits the capabilities of the telephone system. Although coaxial cable installation in the home run "star" configuration is recommended, homes are still occasionally wired in a multi-drop method which greatly impairs the capabilities of the video distribution system. In addition to the in-house wiring issue there is a problem of not having a common location for service entrances into the home. Today, the various services, telephone and CATV enter the house at various locations creating unsightly wiring to be dispersed throughout the home along with several holes being created in the walls in order to accommodate these services.

There is a great need in the art to provide a method that provides consistency and corrects the above problems by establishing some kind of wiring scheme that would bring these wires into a common enclosure, thereby centralizing the service entrance and the services' distribution. Such an enclosure would provide a distribution point for telephone, video and audio services throughout the home or building via components such as, but not limited to, splitters, amplifiers and telephone connection blocks.

In today's home, the connection of the incoming telephone and cable TV services to the distribution lines is done in a none standard manner. Typically, screw terminals or wire nuts are used for the telephone twisted pair wires, and cable splitters are used to connect the TV cable coax lines. In the event that the installation of control equipment for these services is desired, installation and connection is time consuming and complex. Reconfiguring the distribution of telephone and cable TV signals is very impractical. The use of a signal distribution center will facilitate the correct wiring of these services and will make system reconfiguration easier and less costly.

SUMMARY OF THE INVENTION

This invention provides one location for telephone/audio and video distribution and service entrance and a logical and organized method of distributing these services throughout the home or building. This invention includes an enclosure, 120 VAC power outlets for devices installed in the enclosure, telephone/audio distribution equipment, video distribution equipment, gateway service entrance hardware and other like communications systems.

In accordance with one aspect of this invention, there is provided a distribution system for the distribution and management of communication and control systems within a facility comprising a distribution center means having terminations therein for services entering the facility, wire means coupled to said distribution center means and coupled to wall terminations, and cable means coupled to said distribution center means and coupled to wall terminations. The system also includes means for distributing the services throughout the facility by formatting the wall terminations of said wire and cable means.

In accordance with another aspect of this invention, there is provided a distribution center for the distribution of management communication and control systems comprising enclosure means, electrical service termination means disposed within said enclosure means, and wire termination means disposed within said enclosure means and grounding means disposed within said enclosure means.

In accordance with another aspect of the present invention, there is provided a service entrance enclosure for the distribution and management of communications systems comprising an enclosure and means for supporting communication component means disposed within the enclosure.

In accordance with another aspect of this invention, there is provided a signal distribution module comprising circuit board means, connector means coupled to the circuit board means for coupling input and output means for reconfiguring the distribution of the input signals to appropriate output signals, and interconnect means for interfacing the programming means to the circuit board.

In accordance with another aspect of this invention, there is provided a system for distributing signals in a facility comprising circuit board means, an input signal port coupled to the circuit board means, a plurality of output signal ports coupled to the circuit board, and programming means coupled to the circuit board means for distributing the input signal to the output ports.

In accordance with another aspect of this invention, there is provided a distribution system for the distribution and management of communication and control systems within a facility comprising distribution center means having terminations therein for services entering the facility, a plurality of signal terminations, signal distribution means for distributing the input signals to appropriate output signals, telecommunications wire means coupled to the signal distribution means and coupled to one of the signal terminations, and coaxial cable means coupled to the signal distribution means and coupled to one of the signal terminations.

It is an object of this invention to provide an improved distribution system which provides consistency and corrects problems facing the prior art, thereby establishing a wiring scheme and common enclosure which will help to centralize a It is also an object of this invention to provide a distribution system that will allow for the enhancement of services to the home via additions to the distribution center at subsequent times.

It is also an object of this invention to provide a distribution module that will allow reconfiguration of the signal distribution system after initial installation.

DETAILED DESCRIPTION OF THE PREFERRED EMBODIMENTS

For a better understanding of the present invention together with other and further advantages, and capabilities thereof, reference is made to the following disclosure and appended claims in connection with the above-described drawings.

In general, the present invention provides for a system and apparatus for locating telephone/audio and video distribution and the service entrance and for a logical and organized method of distributing these services throughout the home or building. The present system also provides a means for future upgrades to products such as advanced video, telephone, intercom, and overall load management. The gateway capability provides a platform for integration and/or modulation of signals and services on the various mediums covered in this concept. Applications that can be applied are in energy management and information services area. Finally, there is described a process by which the distribution system can be reconfigured to meet the customer's needs depending on the upgrades desired in home or building.

Figure 1:
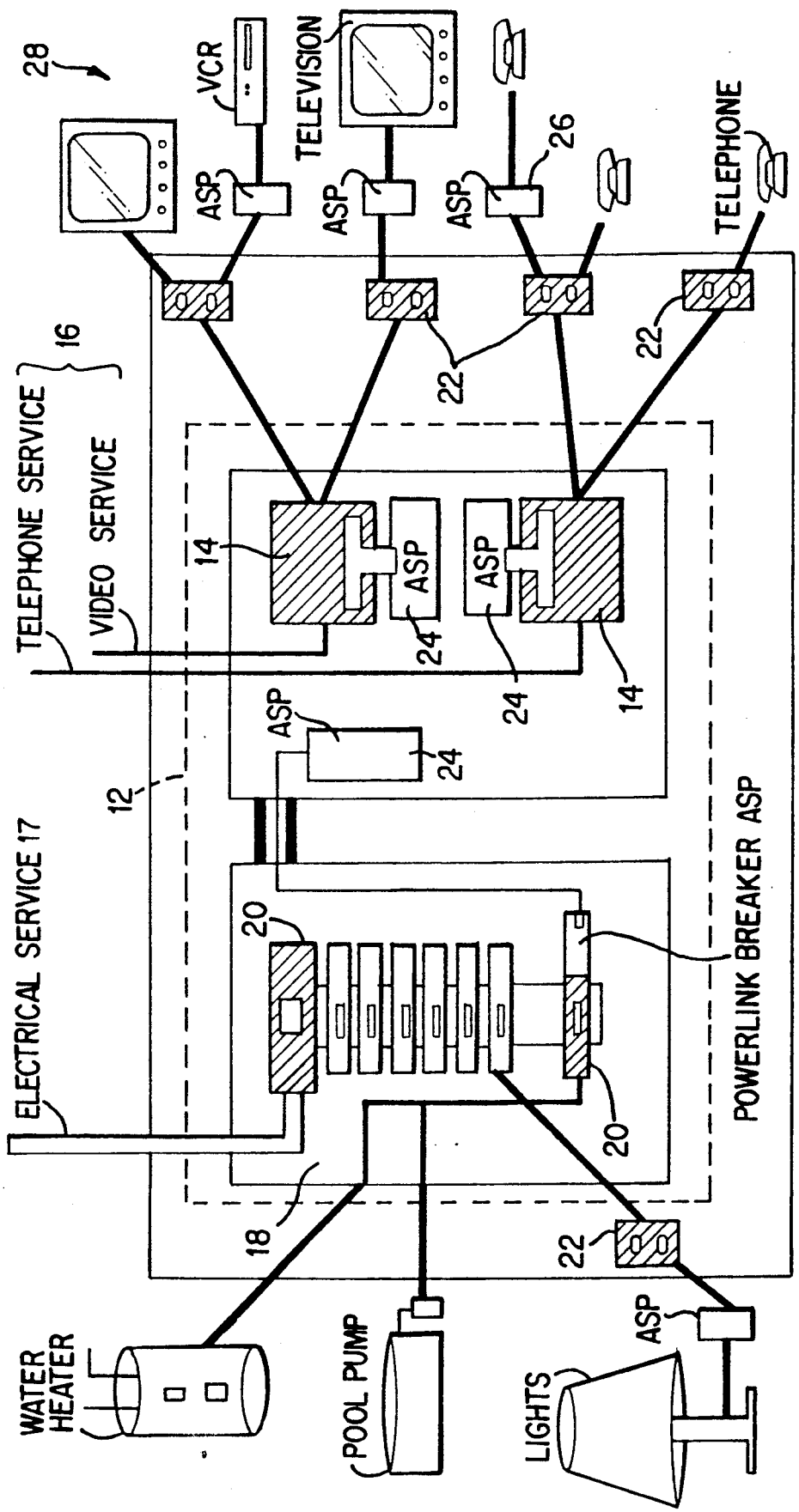
FIG. 1 illustrates a distribution system designed according to the teachings of the present invention.

Referring now to FIG. 1, there is illustrated a block diagram of an example of a distribution system for a home or building. In particular, the distribution system 10 includes a distribution center 12 having signal distribution modules 14, telecommunication and video services 16 which may also include cable TV. Further illustrated is electrical service 17 coming the circuit breakers in the load center. The load center 18 also has circuit interrupting and energy management devices 20. The wire and cable is then distributed from the distribution center to different parts of the home or building and at wall (service) terminations such as wall termination 22. At these wall terminations, items such as telephones or television sets may be connected directly.

The distribution center also includes application-specific products 24 which may consist of sub-systems for video, telephone/intercom, gateway systems or security. These systems may then be distributed through the existing wiring scheme. There may also be application-specific products 26 which are outside of the distribution center, but which serve as part of the distribution system, which are coupled to wall terminations 22 and are then coupled to equipment or appliances 28, such as televisions or VCRs or lighting systems (see FIG. 1). The different application-specific products or sub-systems provide additional functionality for video, telephone, intercom, audio and electrical energy control by working with the homeowner's standard televisions, VCRs, telephones, stereos and other major appliances (such as a hot water heater). By controlling the delivery of the services to these appliances, the application-specific products (ASPs) can increase and enhance the value of the service to the homeowner.

The distribution system 10 is a stand-alone product and does not require any of the ASPs in order to function. At its lowest level of functionality, the distribution system will provide the following functionality: dual A/B manual switching of video sources; four-line telephone capability manually reconfigurable to extensions; proper grounding for all signals; transient protection for services; and ease of access to services.

Figure 2:
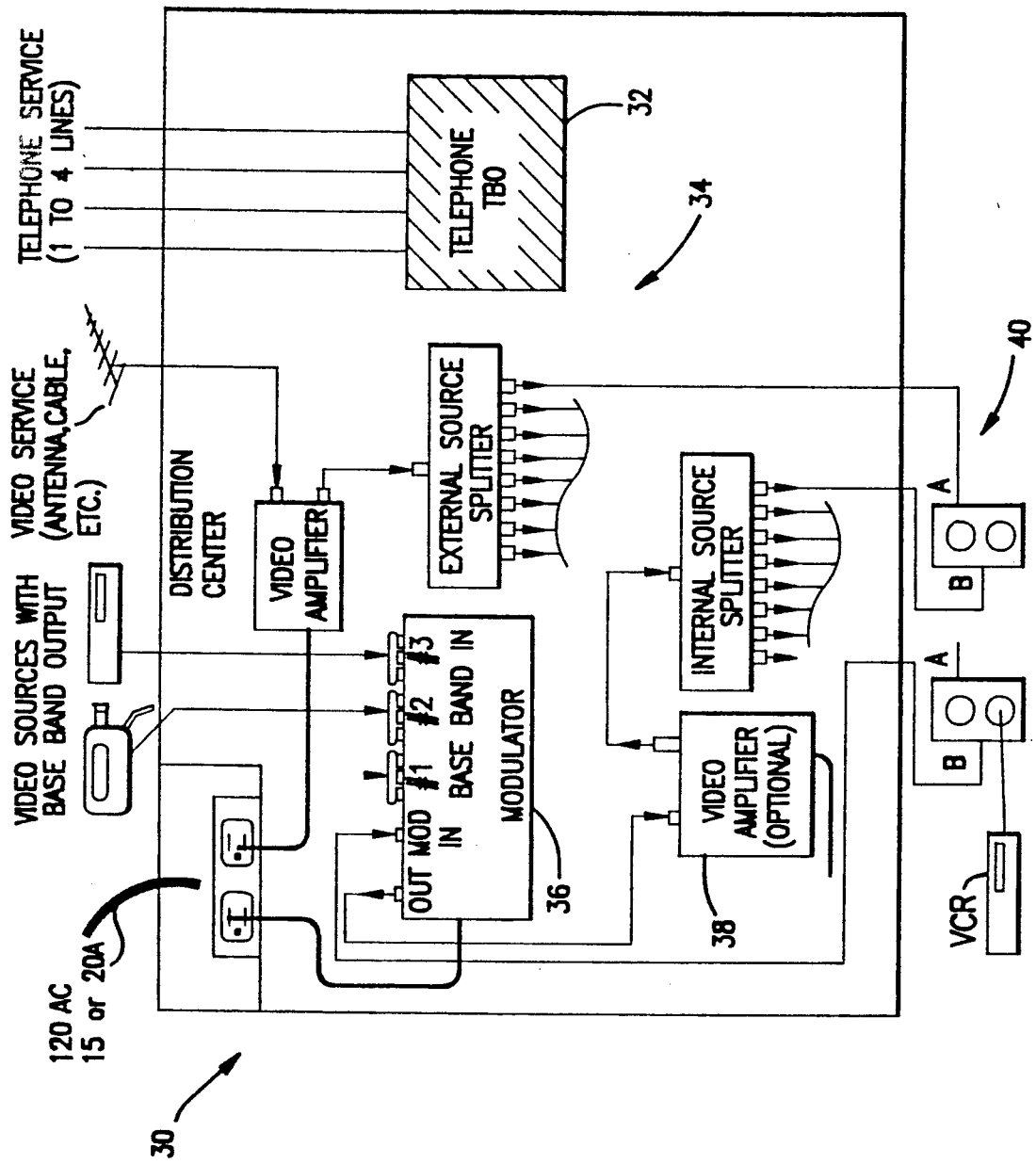
FIG. 2 illustrates a specific embodiment of a distribution center that forms a component of the distribution system.

One example of a distribution center with more features is illustrated in FIG. 2. In FIG. 2, the distribution center illustrated provides, in addition to the basic components, a telephone termination 32 that provides for four incoming telephone or audio lines and distributes all incoming lines to each of a possible 16 extensions. In addition, video termination 34 provides for two separate video circuits (dual A/B manual switched source). For instance "A" will provide input from up to three baseband sources (VCR, security camera, etc.) and one modulated source (CATV, satellite, antenna, etc.) with the help of modulator 36 and an output of up to eight connections. Circuit "B" will provide distribution for internal sources (VCR, security camera) and output to up to eight connections. A video amplifier 38 will be supplied for each circuit if needed. Circuit A and B video wall terminations are illustrated as 40.

Referring to FIGS. 1 and 2, the wire and cable in the distribution system are designed to deliver the services to the wall terminations. Wall terminations provide an ASPs. The video distribution cable is a dual coax A/B system using RG6 coax, for example. The wall terminations are a dual feed through wall plate using F-type connectors. The telephone services usually delivered via an eight-conductor 24AWG cable and is terminated by a dual RJ11 jack wall plate. The terminations are duplex receptacles, wall switches and dedicated branch circuit breakers.

Referring further to FIG. 1, signal distribution modules 14 serve as connection points for the wire and cable of the distribution system. Quick and simple terminations can be used, and these terminations will facilitate easy installation and provide for troubleshooting of the system.

Figure 6:
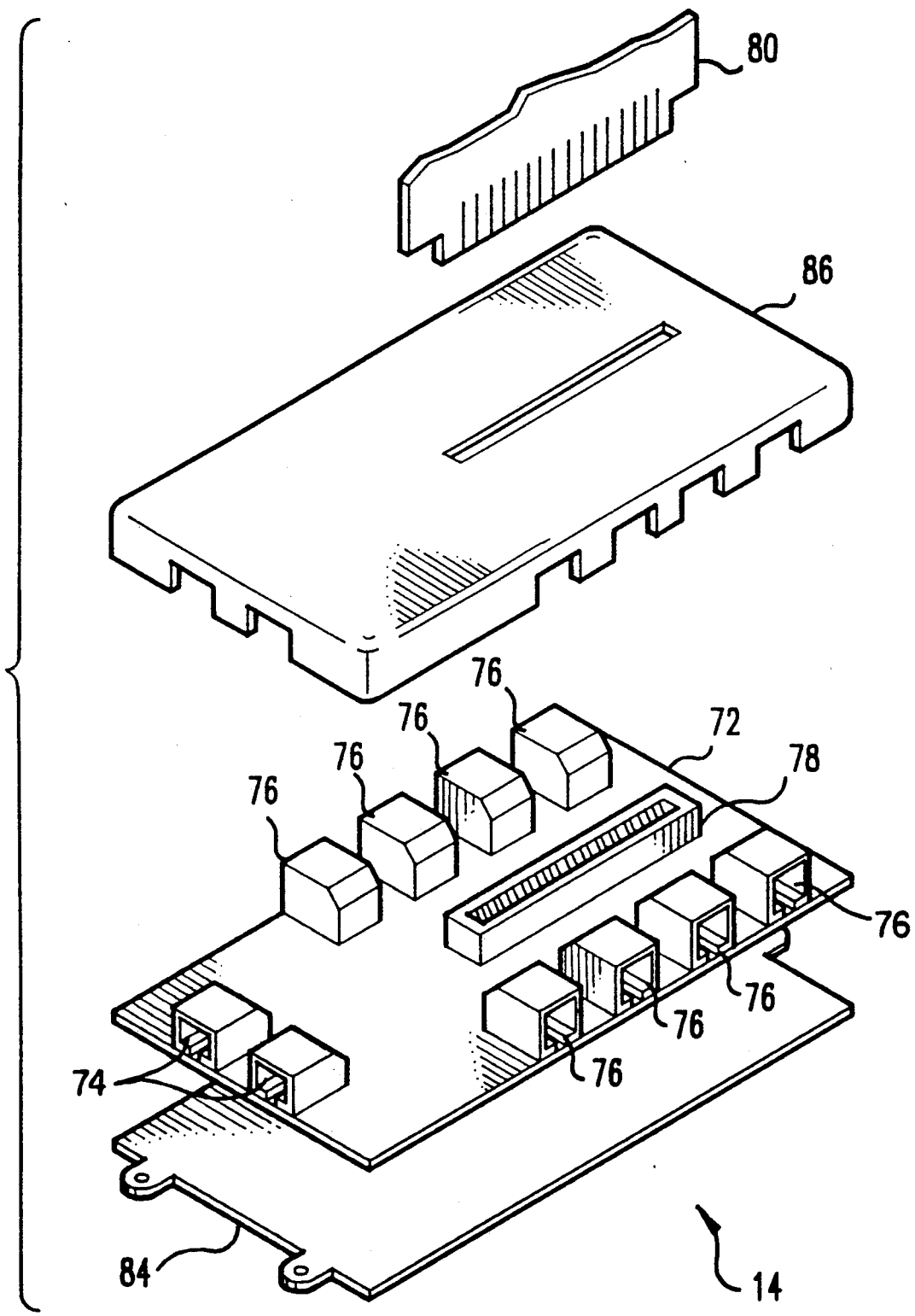
FIG. 6 illustrates signal distribution module designed according to the teachings of the present invention.
Figure 8:
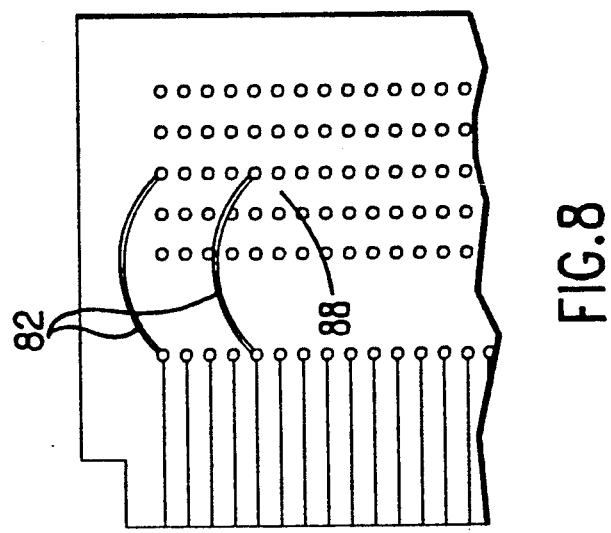
FIG. 8 illustrates another embodiment of a specific component integral
Figure 7:
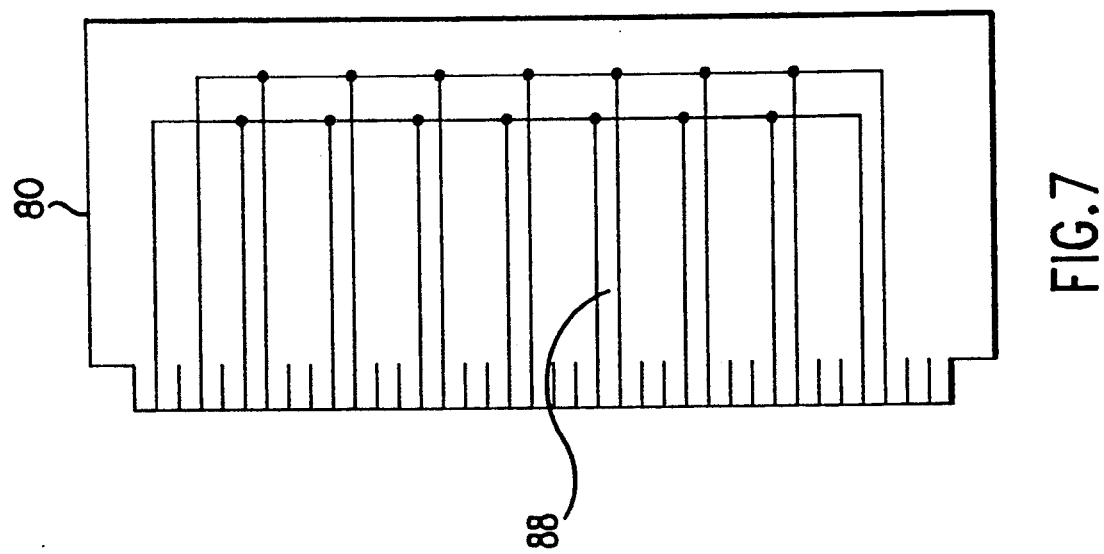
FIG. 7 illustrates an embodiment of a specific component integral to the signal distribution module.

Referring now to FIGS. 6 through 8, there is illustrated a signal distribution module 14 for distributing telephone, video, audio, data, intercom, or any other electrical signal throughout a facility. Input signals, such as telecommunication and video services 16, FIG. 1, are transmitted on discrete or coaxial cables and are coupled to circuit board 72 via input connector means (or ports) 74. Output distribution signals are coupled to circuit board 72 via output connector means (or ports) 76. The input and output connector means may be modular jacks, insulation displacement connectors, screw terminals, solder joints, or other connection means (or ports).

Input and output signals are connected to interconnect connector 78. Programming card 80 mates with interconnected connector 78 for transferring the input and output signals to the programming card 80. The interconnect connector 78 may be an edge connector, broadband connector, pin header or socket, fiber optic connector, or other connector means used for coupling electrical or optical signals.

The programming card 80 distributes each input signal to appropriate output signals via an interconnecting matrix 88, as shown in FIGS. 7 and 8. The interconnecting matrix may be hard wired onto a printed circuit board, as shown in FIG. 7, or jumper wired with jumpers 82 as shown in FIG. 8. The distribution of signals may be reconfigured by changing the programming card or jumper configuration. Other embodiments of signal distribution include embedding a matrix circuit directly on circuit board 72, incorporating a microprocessor onto circuit board 72 or programming card 80, or any other signal control means. Signal distribution may be controlled external to the signal distribution module by coupling the programming means to an external controller. This coupling can be via electrical cable, optical cable, RF, ultrasonic, or other communication means.

An optional cover 86 and base 84 may be provided to protect the internal components. It is possible to provide a guide and keying means for assistance in connecting the programming card to the interconnect connector. Other optional items include mounting means for mounting the signal distribution module to an enclosure and a method for indicating tampering with the module. With respect to the circuit interrupting devices 20, such will provide connection of electrical power to major appliances or systems requiring some kind of energy management.

Figure 3:
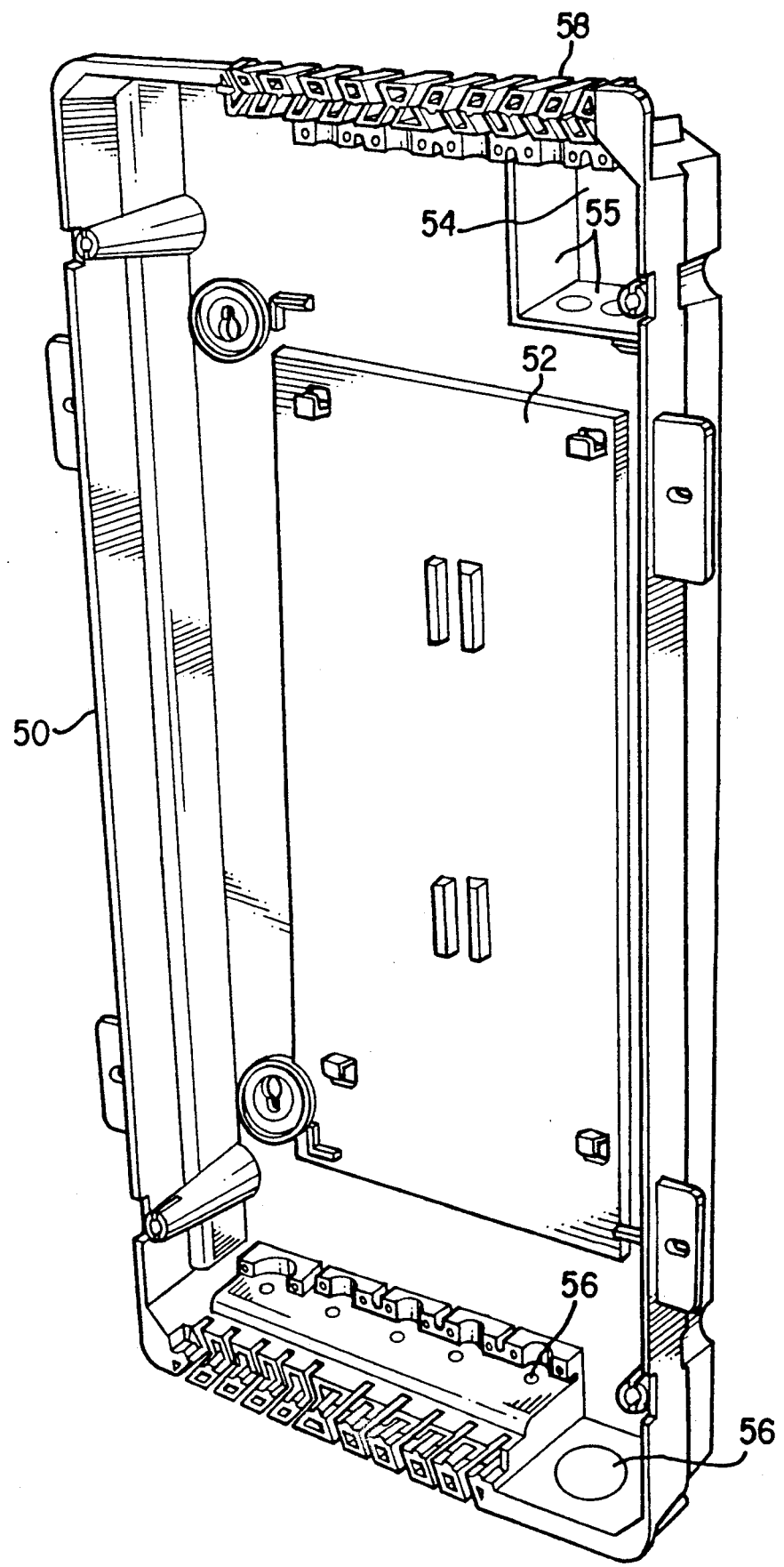
FIG. 3 illustrates the service entrance enclosure with a communications component mounting plane and a receptacle barrier.

In FIG. 3, there is illustrated one embodiment of the service entrance enclosure 50 that forms part of the distribution system. The enclosure 50 is shown here without a cover and in this particular instance is made from molded plastic. The teachings of this invention may, however, be applied to other enclosures of different materials or configurations.

As is illustrated in FIG. 3, enclosure 50 has a back wall, a pair of opposing frontwardly extending endwalls that are integral with the back wall and a first and second opposing frontwardly extending side walls, the sidewalls of which are integral with the back wall and endwalls and serve to define enclosure 50. Enclosure 50 also has a back plane or mounting plane 52 which fits within the enclosure and provides a means for mounting all of the distribution center components except for the electrical power section. Mounting plane 52 may be molded into the enclosure or may also be a plate made of steel or plastic to allow thread-forming or thread-tapping screws (or any other suitable method) to attach the components.

Enclosure 50 further includes a receptacle 54 which has a receptacle barrier 55 in order to isolate the power from the communications within the enclosure. On the opposite end of enclosure 50 there is illustrated a plurality of detachable disks of knockouts 56 which are used to provide an access for the service entrance electricity or egress for the cables and wires distributed from the enclosure.

Finally, the enclosure includes a plurality of clamps 58 integral with the enclosure 50 to allow for ease of clamping of cables.

Figure 4:
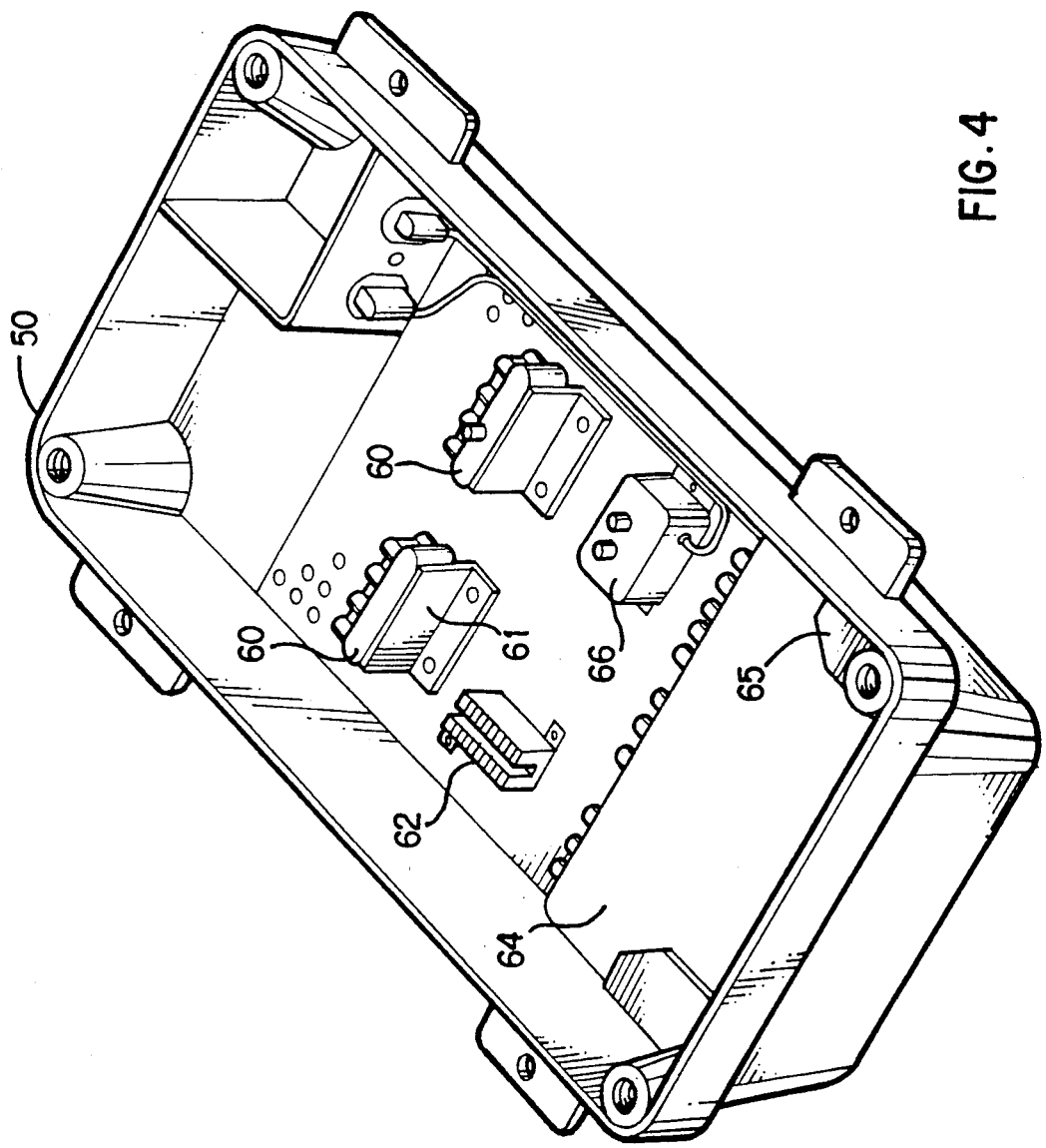
FIG. 4 illustrates one embodiment of the enclosure with a pair of coaxial splitters and a telephone connector block.

Referring to FIG. 4, there is illustrated another version of enclosure 50 having some of the communication components mounted therein. In particular, in this embodiment, there is shown a pair of coaxial splitters 60 which are held to mounting plane 52 via bracket 61. In addition, there is a telephone punch-down block 62 which is also attached to mounting plane 52. Further, there is shown a modulator 64 which is held in place by a pair of brackets 65 and a signal or video amplifier 66 which is also mounted to plane 52.

In one embodiment, the signal amplifier 66 is coupled to one of the coaxial splitters in order to enhance the signal emanating from that splitter. Even though the cover is not shown, a cover can be provided that has a door which will provide for access to the components within the enclosure while blocking off the receptacle area to prevent any contact with the electrical portion while other portions of the enclosure are being serviced.

Figure 5A:
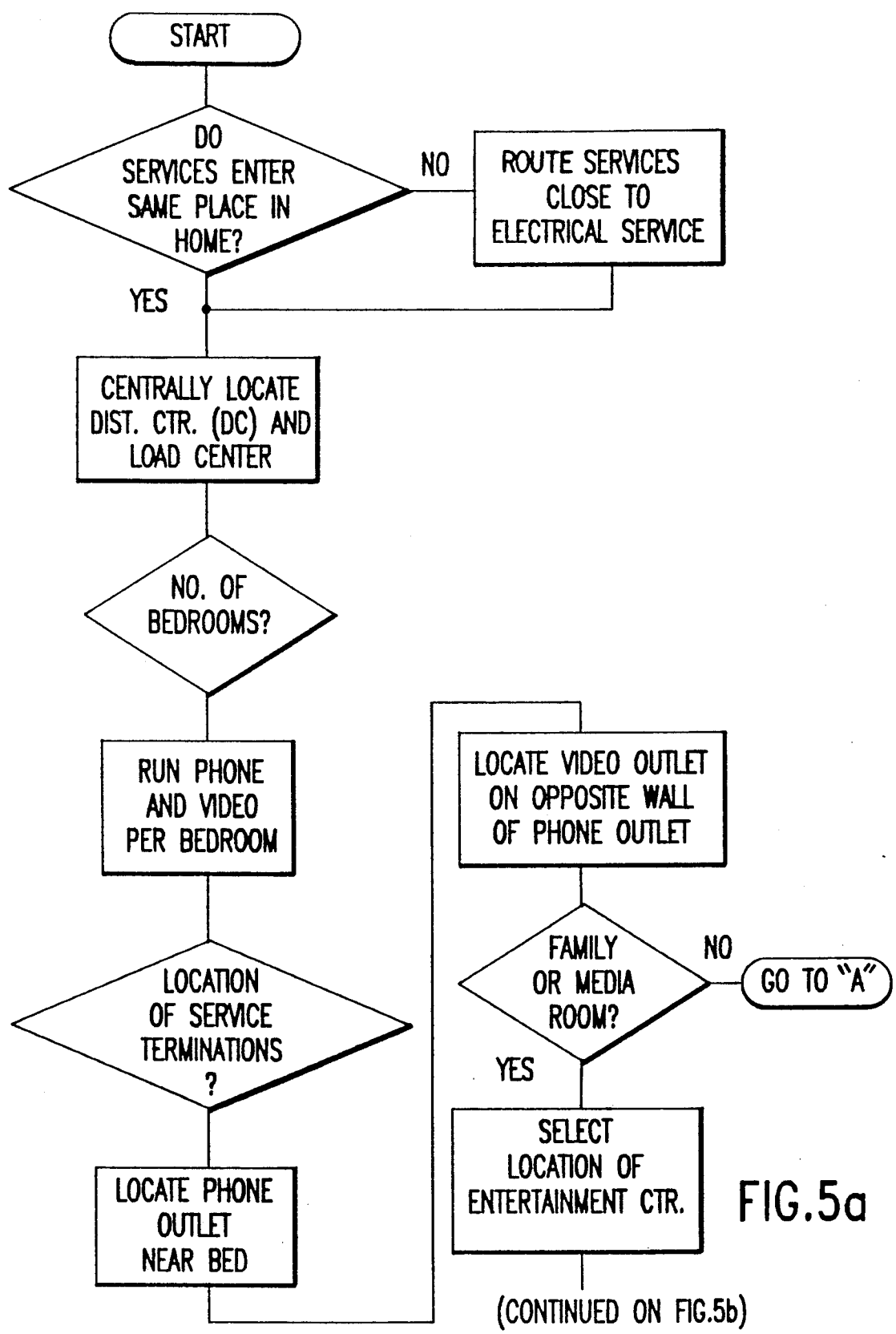
FIGS. 5a through 5c illustrate the flowchart of the process for formatting the wire and cable throughout a facility.
Figure 5B:
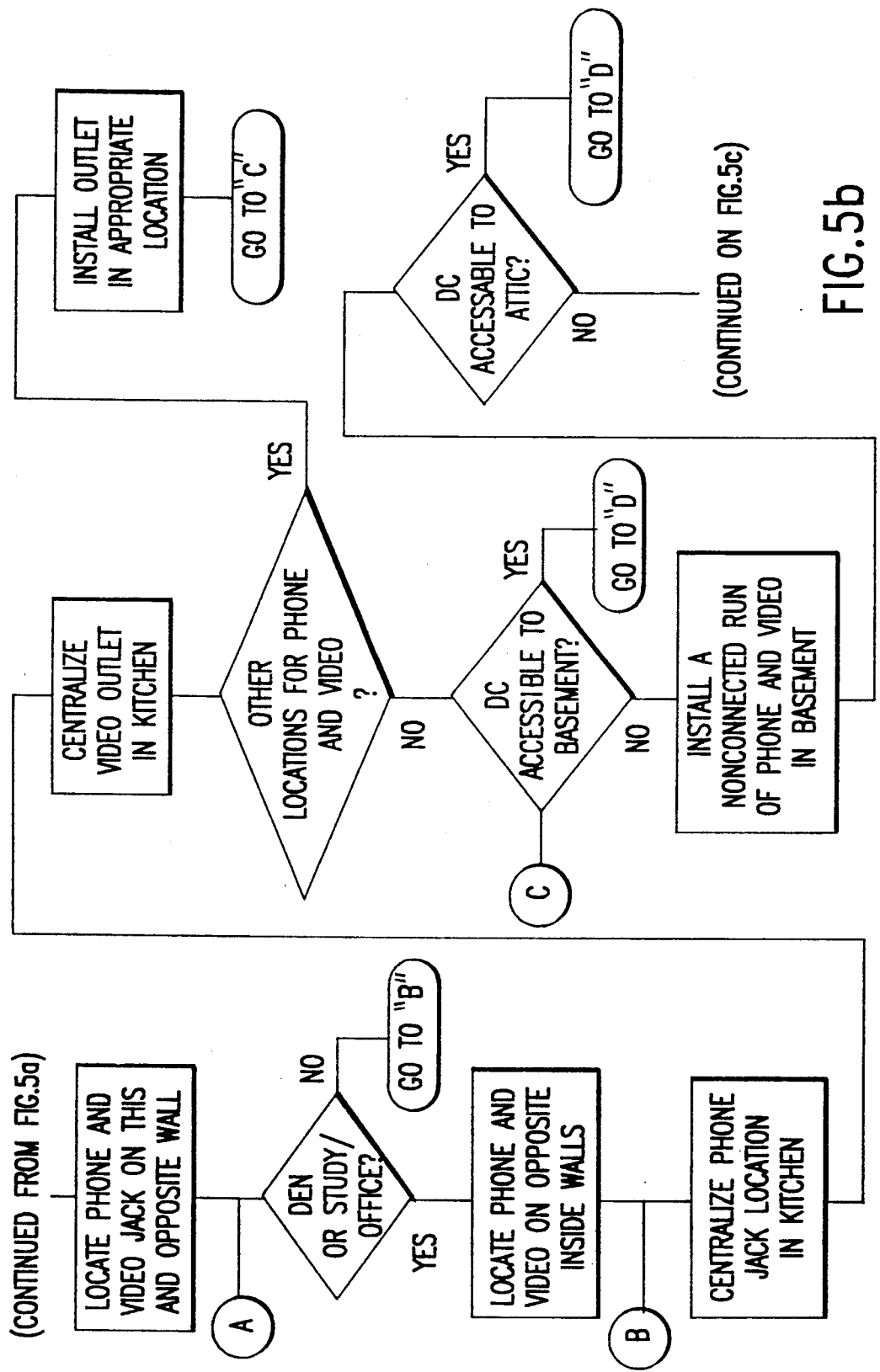
Figure 5C:
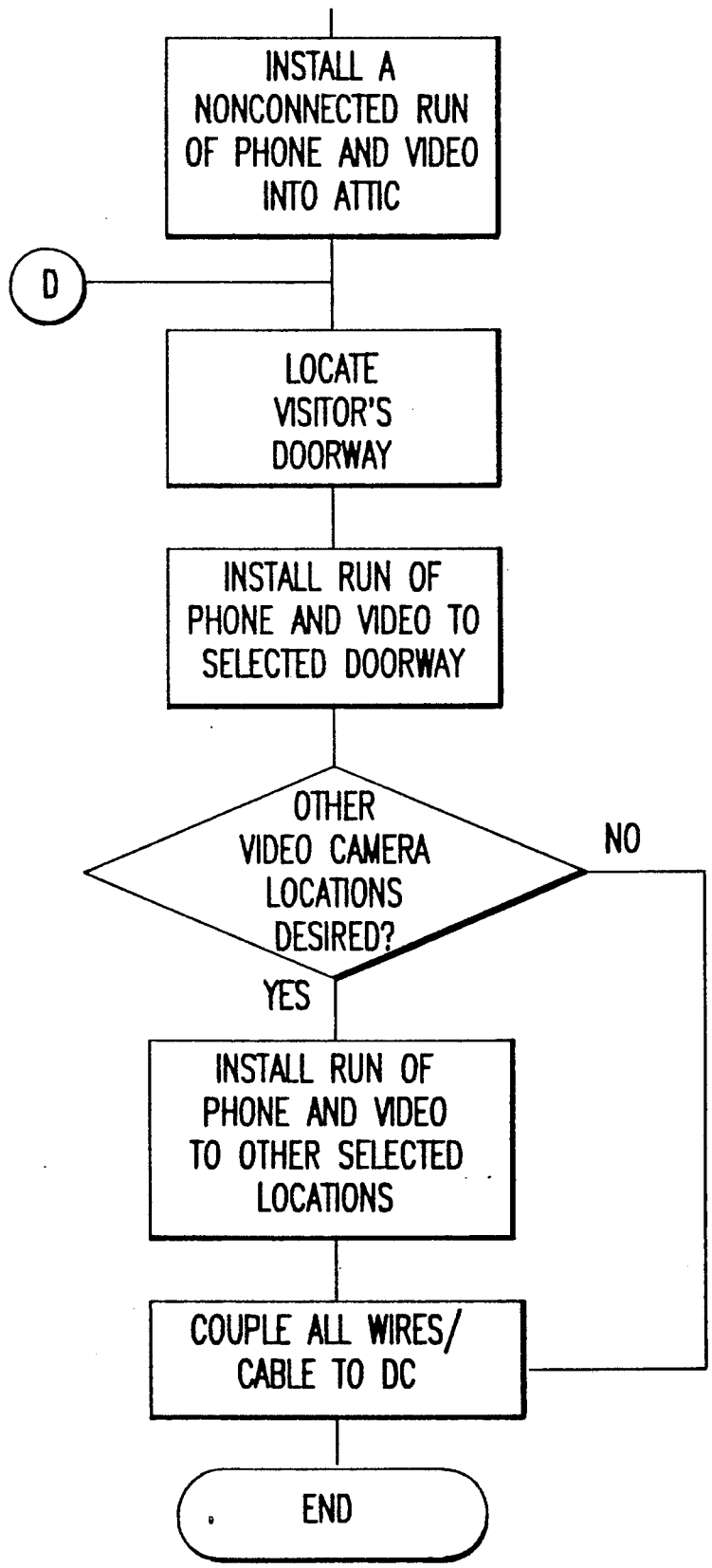

FIGS. 5a through 5c illustrate the flowchart that would normally be used in order to properly install the wire and cable of the distribution system in a home with certain selected features. The flowchart may facilitate the planning of the wiring throughout the home. As part of this formatting program, it is necessary to consider the use of specific wire and cable types and provide detail on how the wire and cable should be installed.

In one example, the wiring and cable installation format would consist of the following: dual coax home runs to each video wall termination, eight-conductor (four pair) telephone wire home runs to each telephone termination (24AWG), dedicated electrical circuits for all major appliances (hot water, pool pump, range, etc.), and dedicated circuits for outdoor perimeter lights.

Another element of the formatting procedure is the specification for the location of wall terminations. Family rooms, dens, living rooms, have telephone and video wall terminations on opposite walls, while bedrooms, dining rooms, etc. all have video and telephone wall terminations in logical locations. The wall terminations would include dual feed through wall plate using F-connectors for video, dual RJ11 jack wall plates, single wall-mount phone RJ11 jack wall plate, standard duplex outlet for electricity and standard single and multipole switches.

Referring now to FIGS. 5a through 5c, the following will be a brief description of the method for formatting the wire and cable throughout a facility (in this example, a house). In FIG. 5a, at the top of the flowchart, you determine if all the services enter the home at the same location. If not, location that is near the electrical service entrance. If so, go on to determine the most central logical location for the distribution center which may also include the loadcenter.

Next, you determine the number of bedrooms so that you can plan on running wire and cable to each bedroom for telephone and video services. Next, you try to determine where the wall terminations will be located so that you can locate the telephone outlet on the wall nearest the head of the bed in the bedroom, thereafter locating the video outlet on the opposite wall of the telephone outlet.

Next, you determine if there is a family or media room, and, if there is, you must situate the entertainment center and then locate a telephone and video jack on that wall and on the opposite wall. Referring to FIG. 5b, if there is no family room or media room, you ask yourself if there is a den or study or office. If so, you locate the telephone and video on the opposite inside walls. If not, you move on to the next step for both situations in the flowchart.

Next, you ask yourself if there are other logical locations for the telephone and video connections. If so, such should be installed in the most appropriate locations in the home, and thereafter you can determine whether or not the distribution center is accessible to the basement or to the attic in order make appropriate connections to the distribution center.

Finally, referring to FIG. 5c, you determine whether it is necessary to provide for video cameras at such locations. This is to provide the customer with the option for security service at the door. However, this is not essential to the formatting procedure. All of the wire and cable can then be coupled to the distribution center and service terminations in each location of the home.

While there have been shown and described what are at present considered the preferred embodiments of the invention, it will be obvious to those skilled in the art that various changes and modifications may be made therein without departing from the scope of the invention as defined by the appended claims.

What is claimed is:

1. A signal distribution module comprising:
   a housing;
   circuit board means disposed within said housing;
   at least one input connector means coupled to said circuit board means for electrically coupling at least one input signal to said circuit board means;
   a plurality of input connector means coupled to said circuit board means for electrically coupling output signals to said circuit board means; and
   programming means electrically coupled to said circuit board means through an aperture in said housing for configuring the distribution of said at least one input signal to said output connector means, wherein said programming means is reconfigurable and is readily removable from said circuit board means without opening said housing.

2. A signal distribution module according to claim 1, wherein said programming means is disposed on second circuit board means.

3. The signal distribution module of claim 1 wherein said programming means comprises a circuit board having a jumper matrix thereon.

4. The signal distribution module of claim 1 wherein said input signal is a telephone signal.

5. A signal distribution module comprising:
   a base;
   a cover connected to said base having an aperture therein;
   a first circuit board mounted to said base;
   a second circuit board;
   input connector means coupled to said first circuit board for electrically coupling at least one input signal to said first circuit board;
   output connector means coupled to said first circuit board for electrically coupling a plurality of output signals to said first circuit board;
   interconnect means coupled to said first circuit board means for electrically coupling said second circuit board to said first circuit board, wherein said at least one input signal and said plurality of output signals are electrically coupled to said second circuit board means through said interconnect means; and
   programming means integral with said second circuit board for distributing said at least one input signal to at least one of said plurality of output signals, wherein said programming means is reprogrammable and said second circuit board is connectable through said aperture in said cover and is readily removable from said first circuit board without removing said cover from said base.

6. The signal distribution module of claim 5 wherein said interconnect means comprises an edge connector.

7. A signal distribution module according to claim 5, wherein said programming means includes an interconnection matrix.

8. A signal distribution module according to claim 7, wherein said interconnection matrix is hard wired onto a printed circuit board.

9. A signal distribution module according to claim 7, wherein said interconnection matrix comprises a jumper wired scheme.

* * * * *

UNITED STATES PATENT AND TRADEMARK OFFICE
CERTIFICATE OF CORRECTION

PATENT NO. : 5,130,893

DATED : July 14, 1992

INVENTOR(S) : STRAATE et al.

It is certified that error appears in the above-identified patent and that said Letters Patent is hereby corrected as shown below:

In Claim 1, line 38, [output] should read _input_

Signed and Sealed this

Fifteenth Day of June, 1999

Attest:

Q. TODD DICKINSON

*Attesting Officer*

*Acting Commissioner of Patents and Trademarks*